(12) United States Patent
Chen

(10) Patent No.: US 11,784,099 B2
(45) Date of Patent: Oct. 10, 2023

(54) METHOD FOR REPLACING OR PATCHING ELEMENT OF DISPLAY DEVICE

(71) Applicant: MIKRO MESA TECHNOLOGY CO., LTD., Apia (WS)

(72) Inventor: Li-Yi Chen, Tainan (TW)

(73) Assignee: MIKRO MESA TECHNOLOGY CO., LTD., Apia (WS)

( * ) Notice: Subject to any disclaimer, the term of this patent is extended or adjusted under 35 U.S.C. 154(b) by 114 days.

(21) Appl. No.: 17/643,174

(22) Filed: Dec. 7, 2021

(65) Prior Publication Data

US 2022/0102223 A1 Mar. 31, 2022

Related U.S. Application Data

(63) Continuation-in-part of application No. 16/505,717, filed on Jul. 9, 2019, now abandoned.

(51) Int. Cl.
*H01L 21/66* (2006.01)
*H01L 33/00* (2010.01)
(Continued)

(52) U.S. Cl.
CPC ............ *H01L 22/12* (2013.01); *H01L 21/683* (2013.01); *H01L 25/0753* (2013.01);
(Continued)

(58) Field of Classification Search
CPC .......... H05K 3/30; H05K 3/301; H05K 3/303; H05K 3/305; H05K 3/325; H05K 13/046; H05K 13/0469; H05K 13/0486; H05K 13/0815; H05K 13/082; H05K 13/083; Y10T 29/4913; Y10T 29/4973; Y10T 29/49815; Y10T 29/49817; Y10T 29/49822; Y10T 29/49885; Y10T 29/49982; Y10T 29/53174; Y10T 29/53178; Y10T 29/53274; H01L 21/67144; H01L 21/67259; H01L 21/6835; H01L 24/29; H01L 24/74; H01L 24/75; H01L 24/799; H01L 24/83; H01L 24/95; H01L 24/98; H01L 2221/68363; H01L 2224/80097; H01L 2224/80143;
(Continued)

(56) References Cited

U.S. PATENT DOCUMENTS

2009/0023243 A1 1/2009 Koyanagi
2015/0048523 A1 2/2015 Suga et al.
(Continued)

*Primary Examiner* — Peter Dungba Vo
*Assistant Examiner* — Joshua D Anderson
(74) *Attorney, Agent, or Firm* — CKC & Partners Co., LLC

(57) ABSTRACT

A method for replacing an element of a display device includes: forming a structure with a first liquid layer between a first micro device and a conductive pad of a substrate in which the first micro device is gripped by a sticking force produced by the first liquid layer; evaporating the first liquid layer such that the first micro device is bound to the substrate; determining if the first micro device is malfunctioned or misplaced; removing the first micro device when the first micro device is malfunctioned or misplaced; forming another structure with a second liquid layer between a second micro device and the conductive pad of the substrate in which the second micro device is gripped by a sticking force produced by the second liquid layer; and evaporating the second liquid layer such that the second micro device is bound to the substrate.

10 Claims, 10 Drawing Sheets

(51) Int. Cl.
*H01L 25/075* (2006.01)
*H01L 21/683* (2006.01)

(52) U.S. Cl.
CPC .... *H01L 33/005* (2013.01); *H01L 2933/0016* (2013.01); *H01L 2933/0066* (2013.01)

(58) Field of Classification Search
CPC . H01L 2224/80894; H01L 2224/80895; H01L 2224/80908; H01L 2224/81097; H01L 2224/81143; H01L 2224/81894; H01L 2224/81895; H01L 2224/82908; H01L 2224/83002; H01L 2224/8302; H01L 2224/83097; H01L 2224/83102; H01L 2224/83143; H01L 2224/83805; H01L 2224/8383; H01L 2224/83886; H01L 2224/83894; H01L 2224/83895; H01L 2224/83908; H01L 2224/84143; H01L 2224/95001; H01L 2224/95146
See application file for complete search history.

(56) References Cited

U.S. PATENT DOCUMENTS

| | | |
|---|---|---|
| 2017/0140961 A1 | 5/2017 | Sasaki et al. |
| 2018/0269234 A1 | 9/2018 | Hughes et al. |
| 2020/0020665 A1 | 1/2020 | DiCioccio |
| 2020/0058614 A1 | 2/2020 | Tung et al. |

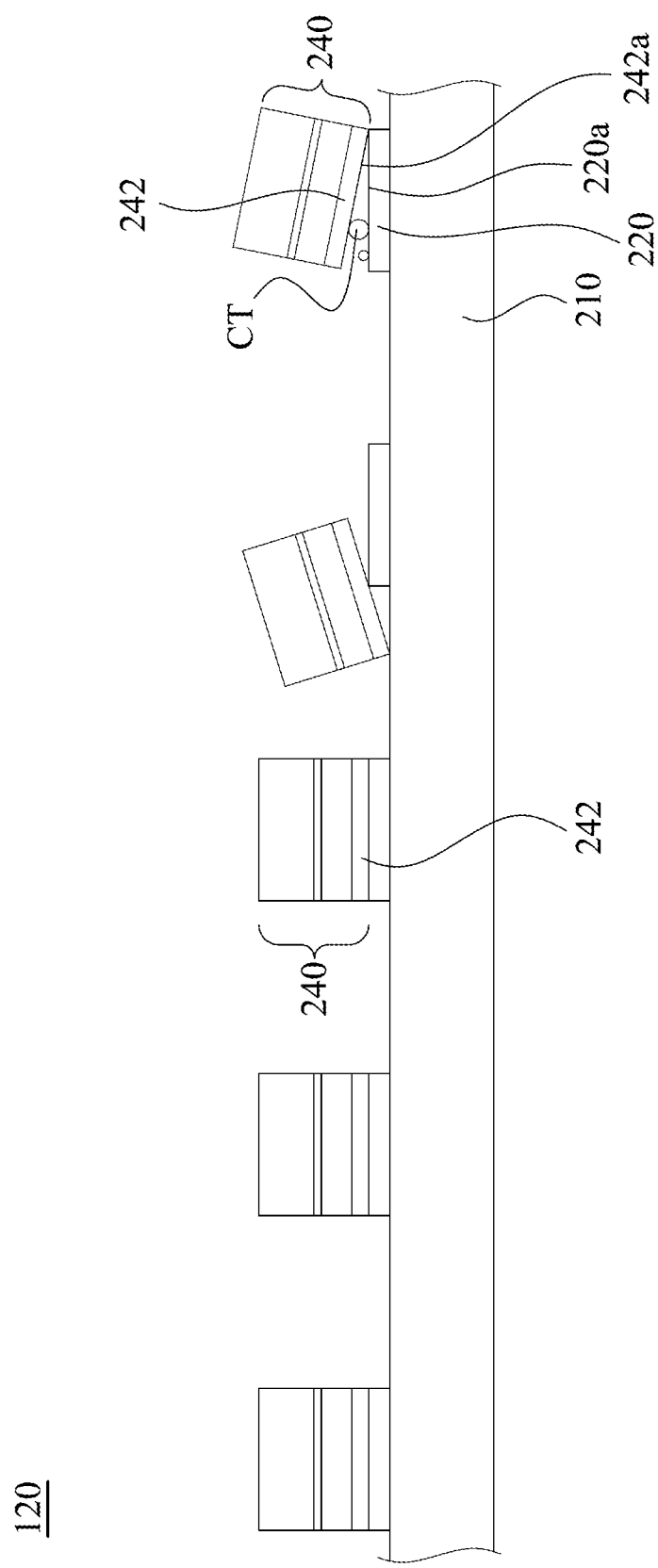

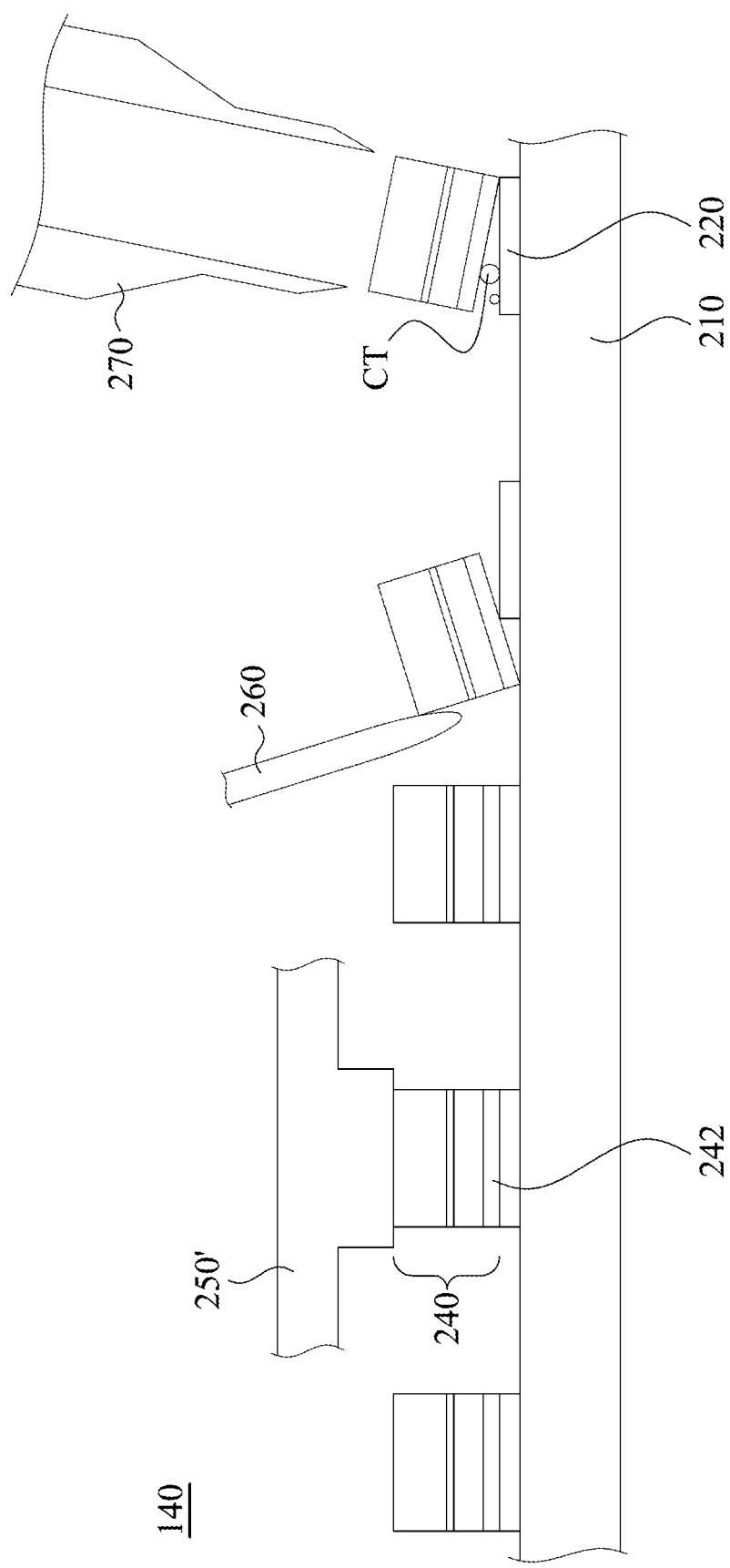

METHOD FOR REPLACING OR PATCHING ELEMENT OF DISPLAY DEVICE

CROSS-REFERENCE TO RELATED APPLICATION

This application is a Continuation-in-part of U.S. application Ser. No. 16/505,717, filed on Jul. 9, 2019, which is incorporated by reference herein.

BACKGROUND

Field of Invention

The present disclosure relates to a method for replacing or patching an element of a display device.

Description of Related Art

The statements in this section merely provide background information related to the present disclosure and do not necessarily constitute prior art.

Traditional technologies for transferring of devices include transfer by wafer bonding from a transfer wafer to a receiving substrate. One such implementation is "direct bonding" involving one bonding step of an array of devices from a transfer wafer to a receiving substrate, followed by removal of the transfer wafer. Another such implementation is "indirect bonding" which involves two bonding/de-bonding steps. In indirect bonding, a transfer head may pick up an array of devices from a donor substrate, and then bond the array of devices to a receiving substrate, followed by removal of the transfer head.

In recent years, many researchers and experts try to overcome difficulties in making a massive transfer of devices (i.e., transferring millions or tens of millions of devices) possible for commercial applications. Among those difficulties, cost down, time efficiency, and yield are three of the important issues.

SUMMARY

According to some embodiments of the present disclosure, a method for replacing an element of a display device is provided. The method includes: forming a structure with a first liquid layer between a first electrode of a first micro device and a conductive pad of a substrate and two opposite surfaces of the first liquid layer being respectively in contact with the first electrode and the conductive pad, in which a lateral length of the first micro device is equal to or smaller than 20 µm, such that the first micro device is gripped by a force produced by the first liquid layer between the first micro device and the conductive pad; evaporating the first liquid layer such that the first electrode is bound to and is in electrical contact with the conductive pad; determining if the first micro device is malfunctioned or misplaced relative to the conductive pad by an optical inspection procedure; removing the first micro device when the first micro device is malfunctioned or misplaced from the conductive pad; forming another structure with a second liquid layer between a second electrode of a second micro device and the conductive pad of the substrate and two opposite surfaces of the second liquid layer being respectively in contact with the second electrode and the conductive pad, in which a lateral length of the second micro device is equal to or smaller than 20 µm, such that the second micro device is gripped by a sticking force produced by the second liquid layer between the second micro device and the conductive pad; and evaporating the second liquid layer such that the second electrode is bound to and is in electrical contact with the conductive pad.

According to some embodiments of the present disclosure, a method for patching a display device is provided. The method includes: forming a structure with a first liquid layer between a micro device and a conductive pad of a substrate; evaporating the first liquid layer; determining if the micro device is absent on the conductive pad; forming another structure with a second liquid layer between an electrode of another micro device and the conductive pad of the substrate and two opposite surfaces of the second liquid layer being respectively in contact with the electrode and the conductive pad, in which a lateral length of the another micro device is equal to or smaller than 20 µm, such that the another micro device is gripped by a sticking force produced by the second liquid layer between the another micro device and the conductive pad; and evaporating the second liquid layer such that the electrode is bound to and is in electrical contact with the conductive pad.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows:

FIG. 4 is a schematic cross-sectional view of an intermediate step of the method for replacing an element of a display device according to some embodiments of the present disclosure;

FIG. 6 is a schematic cross-sectional view of an intermediate step of the method for replacing an element of a display device according to some embodiments of the present disclosure;

DETAILED DESCRIPTION

Figure 1:
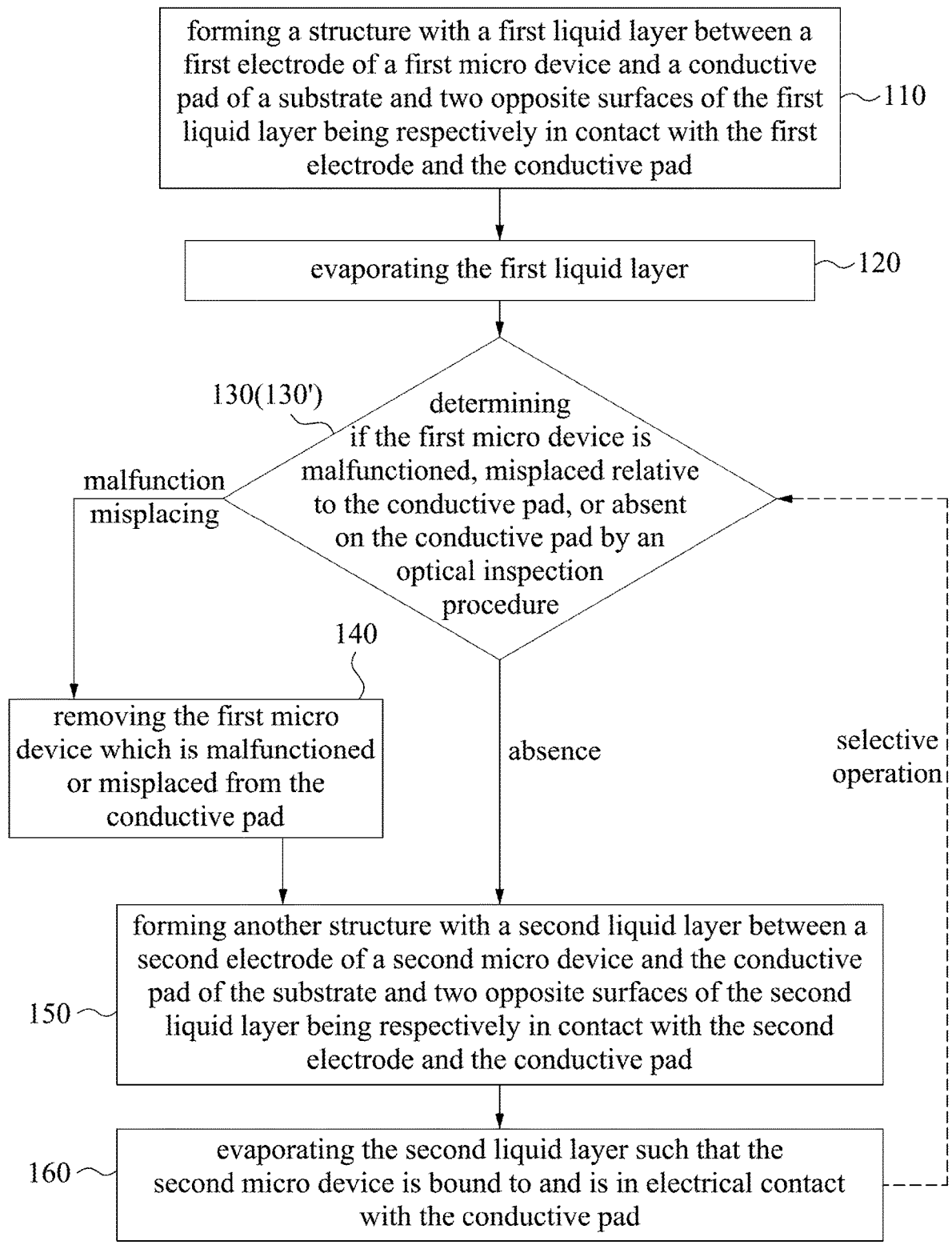
FIG. 1 is a flow chart of a method for replacing or patching an element of a display device according to some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

In various embodiments, the description is made with reference to figures. However, certain embodiments may be practiced without one or more of these specific details, or in combination with other known methods and configurations. In the following description, numerous specific details are set forth, such as specific configurations, dimensions, and processes, etc., in order to provide a thorough understanding of the present disclosure. In other instances, well-known semiconductor processes and manufacturing techniques have not been described in particular detail in order to not unnecessarily obscure the present disclosure. Reference throughout this specification to "one embodiment," "an embodiment" or the like means that a particular feature, structure, configuration, or characteristic described in connection with the embodiment is included in at least one embodiment of the disclosure. Thus, the appearances of the phrase "in one embodiment," "in an embodiment" or the like in various places throughout this specification are not necessarily referring to the same embodiment of the disclosure. Furthermore, the particular features, structures, configurations, or characteristics may be combined in any suitable manner in one or more embodiments.

The terms "over," "to," "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

FIG. 1 is a flow chart of a method for replacing or patching an element of a display device. It is noted that FIG. 1 incorporates two different aspects of the present disclosure so as to provide an overall understanding of different features and the spirit of embodiments of the present disclosure. FIGS. 2 to 9 are schematic cross-sectional views of intermediate steps of the method 100 (100') of FIG. 1 which also includes two different aspects of the present disclosure as mentioned. It is noted that the display device is not labeled because such term (i.e., "display device") is used to describe a whole structure under consideration during descriptions of various embodiments of the present disclosure, and since the present disclosure is related to a method instead of a structure, clearly defining the display device and labeling it in the figures is not necessary and not useful since in different stages (e.g., FIGS. 2 to 9) the display device may contain different structures.

Figure 2:
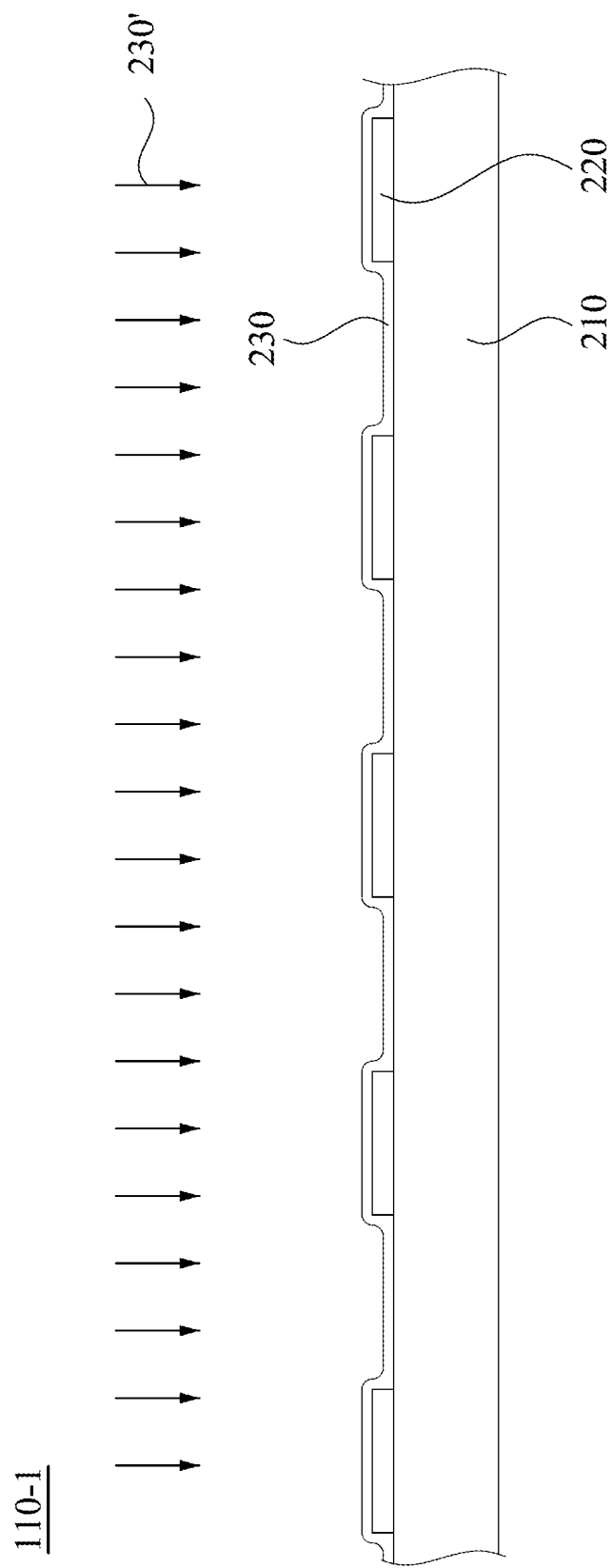
FIG. 2 is a schematic cross-sectional view of an intermediate step of the method for replacing or patching an element of a display device according to some embodiments of the present disclosure.
Figure 3:
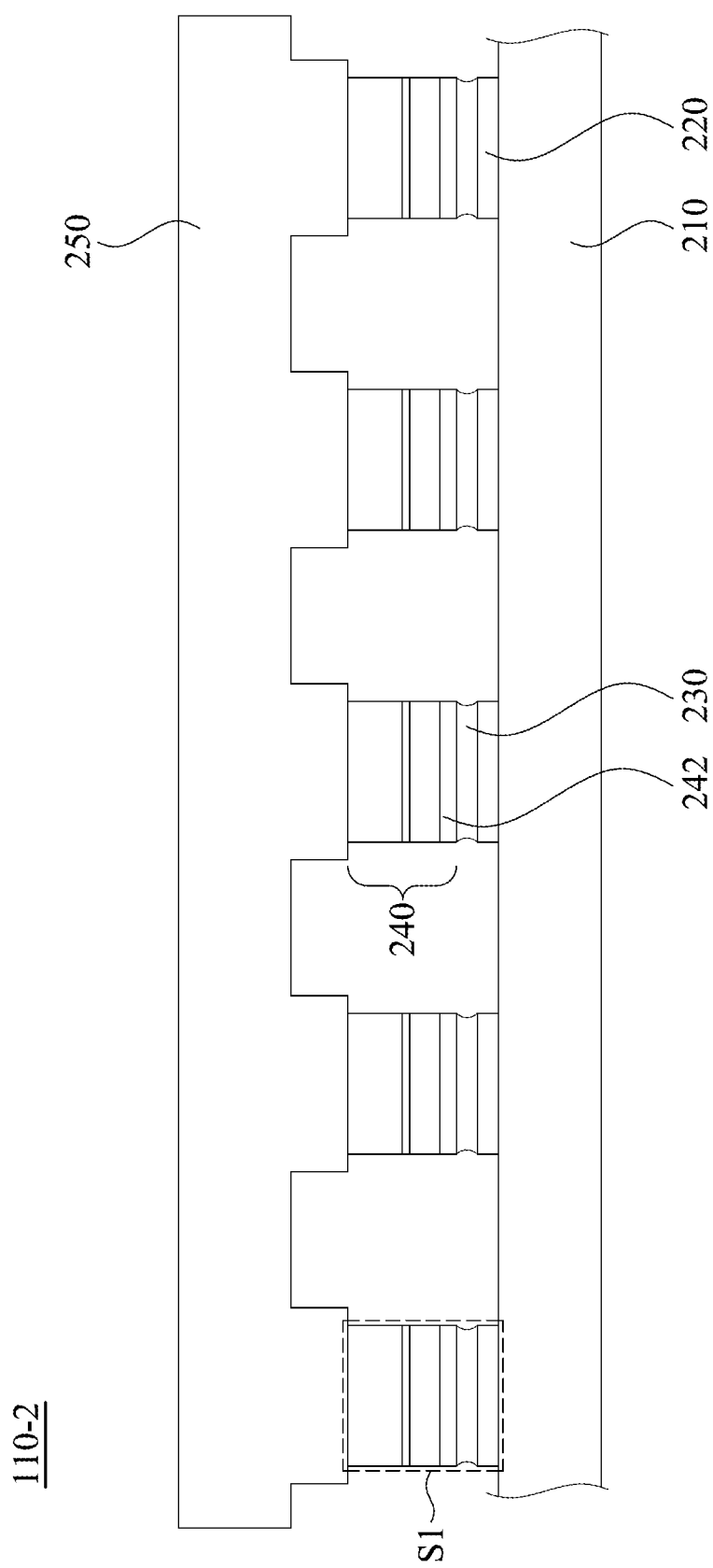
FIG. 3 is a schematic cross-sectional view of an intermediate step of the method for replacing or patching an element of a display device according to some embodiments of the present disclosure.
Figure 5A:
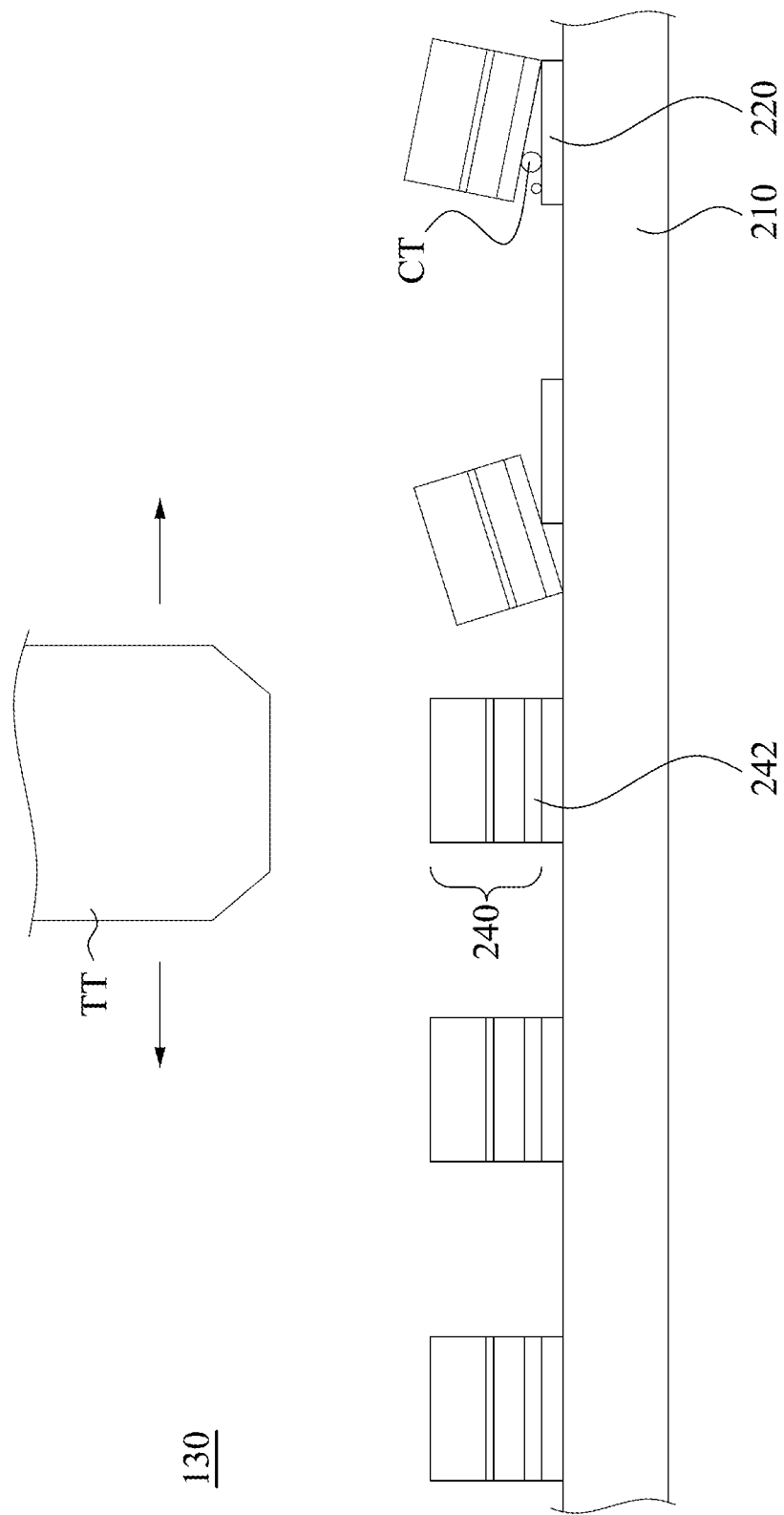
FIG. 5A is a schematic cross-sectional view of an intermediate step of the method for replacing an element of a display device according to some embodiments of the present disclosure.
Figure 7:
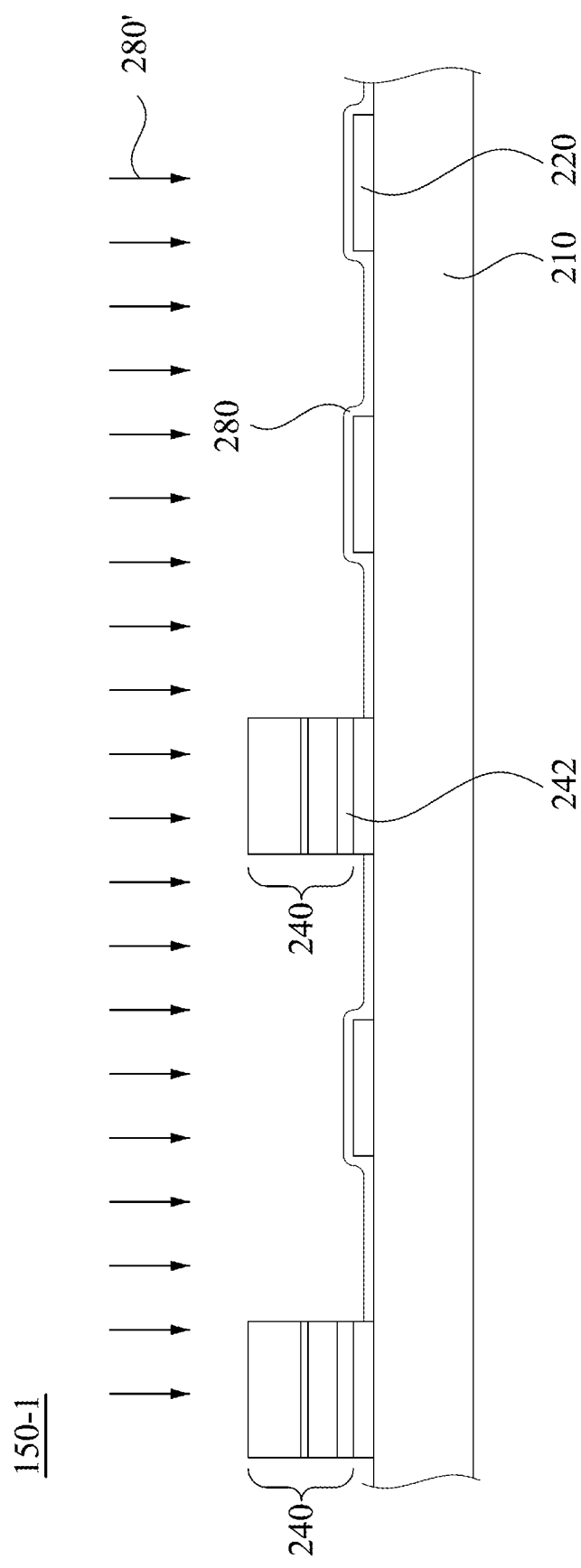
FIG. 7 is a schematic cross-sectional view of an intermediate step of the method for replacing or patching an element of a display device according to some embodiments of the present disclosure.
Figure 8:
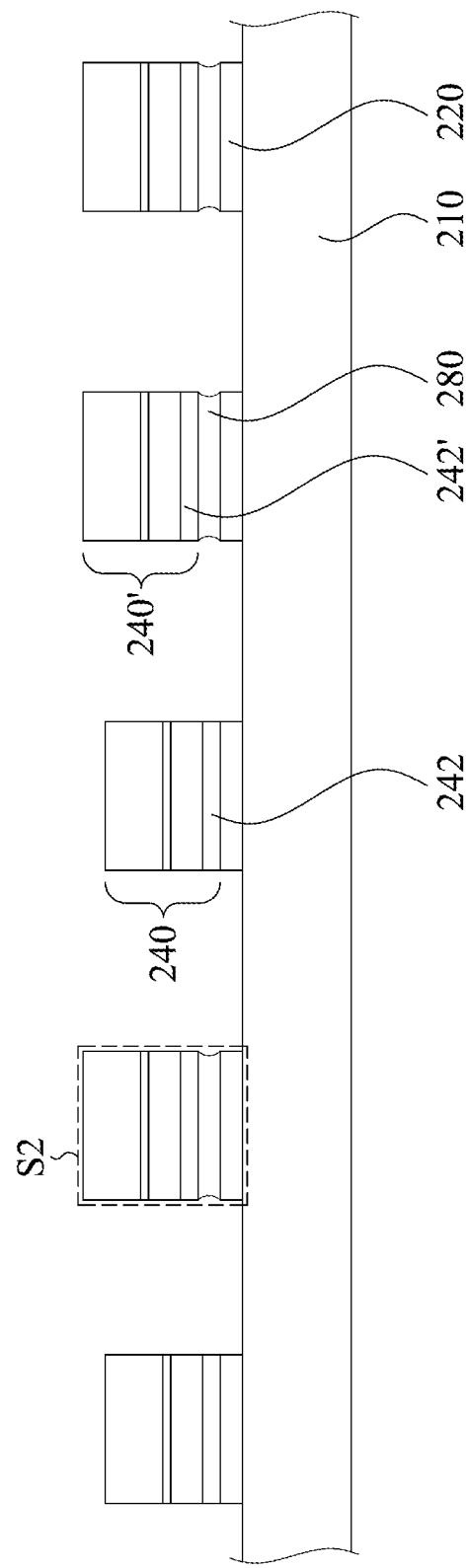
FIG. 8 is a schematic cross-sectional view of an intermediate step of the method for replacing or patching an element of a display device according to some embodiments of the present disclosure.
Figure 9:
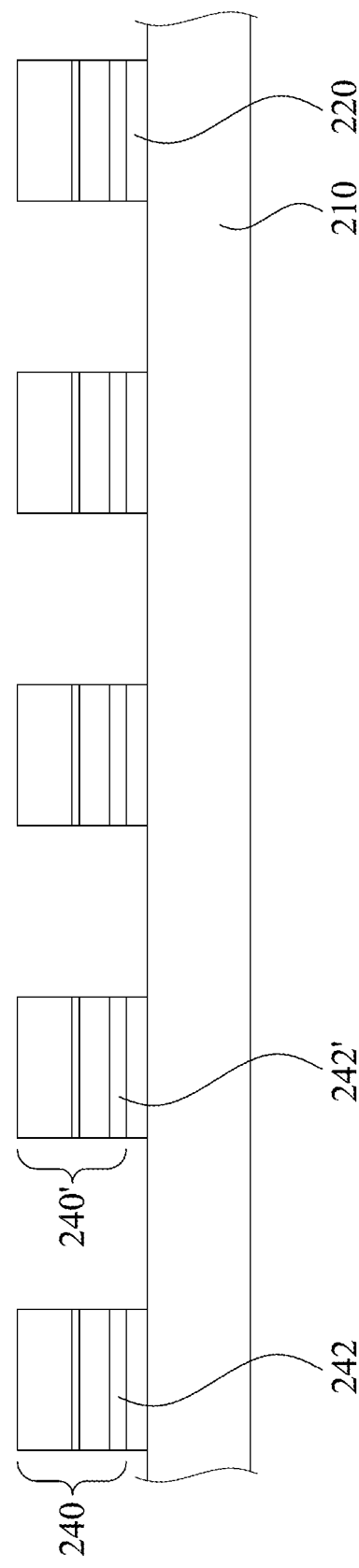
FIG. 9 is a schematic cross-sectional view of an intermediate step of the method for replacing or patching an element of a display device according to some embodiments of the present disclosure.

Reference is made to FIGS. 1 to 5A and 6 to 9. In one aspect, the method 100 for replacing an element of a display device begins with operation 110 in which a structure S1 with a first liquid layer 230 between a first electrode 242 of a first micro device 240 and a conductive pad 220 of a substrate 210 is formed. Two opposite surfaces of the first liquid layer 230 are respectively in contact with the first electrode 242 and the conductive pad 220. Operation 110 can be performed in various ways, and one of them is shown in the following, but should not be limited thereto. The first liquid layer 230 is formed on the substrate 210 (operation 110-1 as illustrated by FIG. 2), and then the first micro device 240 including the first electrode 242 which faces the conductive pad 220 on the substrate 210 is placed over the conductive pad 220, such that the first micro device 240 is in contact with the first liquid layer 230 (operation 110-2 as illustrated by FIG. 3). The method 100 continues with operation 120 in which the first liquid layer 230 is evaporated such that the first electrode 242 is bound to and is in electrical contact with the conductive pad 220 (as illustrated by FIG. 4). The method 100 continues with operation 130 in which a determination is performed to check if the first micro device 240 is malfunctioned or misplaced relative to the conductive pad 220 by an optical inspection procedure (as illustrated by FIG. 5A). The method 100 continues with operation 140 in which the first micro device 240 is removed when the first micro device 240 is malfunctioned or misplaced from the conductive pad 220 (as illustrated by FIG. 6). The method 100 continues with operation 150 in which another structure S2 with a second liquid layer 280 between a second electrode 242' of a second micro device 240' and the conductive pad 220 of the substrate 210 is formed. Two opposite surfaces of the second liquid layer 280 are respectively in contact with the second electrode 242' and the conductive pad 220. Operation 150 can be performed in various ways, and one of them is shown in the following, but should not be limited thereto. The second liquid layer 280 is formed on the substrate 210 (operation 150-1 as illustrated by FIG. 7), and then the second micro device 240' including the second electrode 242' which faces the conductive pad 220 is placed over the conductive pad 220, such that the second micro device 240' is in contact with the second liquid layer 280 (operation 150-2 as illustrated by FIG. 8). The method 100 continues with operation 160 in which the second liquid layer 280 is evaporated such that the second electrode 242' is bound to and is in electrical contact with the conductive pad 220 (as illustrated by FIG. 9).

Although in the previous paragraph only "a" (first) micro device 240 and a conductive pad 220 are mentioned, "multiple" first micro devices 240 and conductive pads 220 may be used in practical applications and is still within the scope of the present disclosure, and will not be emphasized in the disclosure.

Reference is made to FIG. 2. In some embodiments, the substrate 210 includes at least one conductive pad 220 thereon, and the first liquid layer 230 is formed on the substrate 210 and the conductive pad 220. In some embodiments, the conductive pad 220 includes a bonding material. The bonding material includes one of tin, indium, titanium, or a combination thereof. One of tin, indium, and titanium accounts for more than half of a number of atoms of the bonding material. In some embodiments, the conductive pad 220 includes one of copper and a copper-rich material. The copper-rich material is a material with copper accounts for more than half of a number of atoms therein. Although the first liquid layer 230 is continuously distributed and covering the substrate 210 and the conductive pad 220 as shown in FIG. 2, the first liquid layer 230 can also be discontinuously distributed on the substrate 210, such as an island-like first liquid layer 230 covering the conductive pad 220.

In some embodiments, the first liquid layer 230 includes water. In some embodiments, the first liquid layer 230 is formed by lowering a temperature of the substrate 210 in an environment including a vapor such that at least a portion of the vapor is condensed to form the first liquid layer 230. In some embodiments, the temperature of the substrate 210 is lowered to about the dew point to form the first liquid layer 230. In some embodiments as shown in FIG. 2, the first liquid layer 230 is formed by showering a vapor 230' to the substrate 210 such that at least a portion of the vapor 230' is condensed to form the first liquid layer 230 on the substrate 210. Specifically, the vapor 230' includes water. In some embodiments, the vapor 230' has a water vapor pressure higher than an ambient water vapor pressure. In some embodiments, the vapor 230' consists essentially of nitrogen and water.

Reference is made to FIG. 3 in which the structure S1 is formed. In some embodiments, a lateral length of the first micro device 240 is equal to or smaller than 20 μm, such that when the first micro device 240 is in contact with the first liquid layer 230, the first micro device 240 is gripped by a sticking force produced by at least some portions of the first liquid layer 230 which are between the first micro device 240 and the conductive pad 220. The use of the sticking force can be regarded as "liquid layer assisted binding". It should be pointed out that the "liquid layer assisted binding" is preferably effective when the lateral length of the first micro device 240 is equal to or smaller than 20 μm (also applicable to the second electrode 242') since a smaller lateral length of the first micro device 240 results in a scaling effect which facilitates the influence of the sticking force and thus the formation of binding. In some embodiments, the first micro device 240 is placed by a transfer head 250 via a mechanical force (e.g., an adhesive force) or an electromagnetic force (e.g., electrostatic force or an enhanced electrostatic force generated by an alternating voltage through bipolar electrodes), and should not be limited thereto. In some embodiments, a thickness of a portion of the first liquid layer 230 between the first electrode 242 and the conductive pad 220 is smaller than a thickness of the first micro device 240 when the first micro device 240 is gripped by the sticking force produced by the first liquid layer 230. In some alternative embodiments, a sequence between operation 110-1 and operation 110-2 can be changed. That is, the first micro device 240 is placed onto the conductive pad 220 first, and then the first liquid layer 230 is formed on the substrate 210 and a portion of the first liquid layer 230 is penetrated into a space between the first electrode 242 and the conductive pad 220 to grip the first electrode 242 and the conductive pad 220 by the sticking force. In some other alternative embodiments, forming the first liquid layer 230 can be performed both before and after the first micro device 240 is placed onto the conductive pad 220. In still some other embodiments, the first liquid layer 230 is formed on a side of the first micro device 240 opposite to the transfer head 250 when the first micro device 240 is picked up by the transfer head 250 and ready for (i.e., before) contacting the first micro device 240 to the conductive pad 220 by the transfer head 250 (also applicable to the formation of the second liquid layer 280). In some embodiments, the first electrode 242 includes a bonding material (also applicable to the second electrode 242'). The bonding material includes one of tin, indium, titanium, or a combination thereof. One of tin, indium, and titanium accounts for more than half of a number of atoms of the bonding material. In some embodiments, the first electrode 242 (also applicable to the second electrode 242') includes one of copper and copper-rich material. The copper-rich material is a material with copper accounts for more than half of a number of atoms therein.

Reference is made to FIG. 4. In some embodiments, the first liquid layer 230 is evaporated by increasing a temperature of the conductive pad 220 such that the first electrode 242 is stuck to the conductive pad 220 after the first liquid layer 230 is evaporated. As the number of times of performing the placing increases, there may be inevitably some misplacing of the first micro device 240 with respect to the conductive pad 220. Two types of misplacing are shown in FIG. 4 (i.e., the first and second sites of the conductive pad 220 from the right). The first micro device 240 is misplaced with respect to the first site of the conductive pad 220 from the right because of the existence of contaminants CT on the conductive pad 220, and the first micro device 240 is misplaced with respect to the second site of the conductive pad 220 from the right because of, e.g., an operating miss. Besides, there may be malfunction of the first micro device 240 due to, e.g., poor electrical contact, such as the second site of the conductive pad 220 from the left (as an exemplification) in which the first micro device 240 thereon will be picked up by the transfer head 250' as can be seen later in FIGS. 6 and 7. Reference is made to FIG. 5A. In some embodiments, an inspection device TT is used to inspect the malfunction and the misplacing of the first micro device 240 according to the optical inspection procedure mentioned in operation 130. The inspection device TT is an optical inspection device. For example, the inspection device TT may be an optical microscope, but the present disclosure is not limited in this regard.

In some embodiments, with reference to FIG. 5A, the optical inspection procedure may include: inspecting a relationship between a surface 242a of the first electrode 242 facing the conductive pad 220 and a surface 220a of the conductive pad 220 facing the first electrode 242; and determining the first micro device 240 is misplaced if the surface 242a of the first electrode 242 is not parallel to the surface 220a of the conductive pad 220. Once the surface 242a of the first electrode 242 and the surface 220a of the conductive pad 220 are inspected to be non-parallel, it often means that the quality of the electrical connection between the first electrode 242 and the conductive pad 220 will be very poor, which will cause the first micro device 240 to be replaced. In order to precisely inspect the relationship between the surface 242a of the first electrode 242 and the surface 220a of the conductive pad 220, the first electrode 242 and the conductive pad 220 may contain high reflectivity materials, such as metals.

In some other embodiments, with reference to FIG. 5A, the optical inspection procedure may include: detecting an light intensity of a wavelength in a photoluminescence of the first micro device 240; and determining the first micro device 240 is malfunctioned if the light intensity is smaller than a predetermined value. In practical application, the photoluminescence of the first micro device 240 may be produced by irradiating a laser. Once the light intensity of the wavelength in the photoluminescence of the first micro device 240 is inspected to be smaller than a predetermined value, it often means that the first micro device 240 is damaged, which will cause the first micro device 240 to be replaced.

Reference is made to FIG. 6. The first micro device 240 can be removed by the transfer head 250', a needle 260, or a micro clip 270, and should not be limited thereto. In some embodiments, the first micro device 240 is removed by an adhesive force, electrostatic force, or a vacuum suction exerted by the transfer head 250'. In some embodiments, the first micro device 240 is removed by prying off by the needle 260. In some embodiments, the first micro device 240 is removed by mechanical gripping by the micro clip 270. It is noted that the reason for the malfunctioned first micro device 240 (i.e., second one from the left as mentioned) can be successfully removed by the transfer head 250' without causing serious damages on the first electrode 242, the conductive pad 220, and the substrate 210 is that a traditional high temperature "bonding" is replaced by the "liquid layer assisted binding" that form the binding between the first micro device 240 and the conductive pad 220.

As a result, the structural integrity between the first electrode 242 and the conductive pad 220 after binding is strong enough to hold the first micro device 240 on position and form the electrical contact between the first electrode 242 and the conductive pad 220, and is also not too strong such that the first micro device 240 can be removed without causing serious damages on the conductive pad 220 and the substrate 210, which means one can conveniently and repeatedly remove the first micro device 240 from the conductive pad 220 on the same site after inspecting the function and position of the first micro device 240 thereon. Contrary to the "liquid layer assisted binding" as mentioned, the traditional bonding performed by heating until a strong diffusion between the first electrode 242 and the conductive pad 220 occurs makes the resulting bonding between the first electrode 242 and the conductive pad 220 too strong for the first micro device 240 to be removed, which is not appropriate for applications described in the embodiments of the present disclosure.

Given the foregoing explanation, in some auxiliary embodiments, the first electrode 242 is a patterned electrode including at least two isolated portions, and the isolated portions are electrically isolated from one another (also applicable to the second electrode 242'), so as to increase the ratio between the length of a periphery of a contact region and an area of the contact region.

Reference is made to FIG. 7. After removing the first micro device 240 which is malfunctioned or misplaced, the second liquid layer 280 is formed on the substrate 210. In some embodiments, the second liquid layer 280 includes water. In some embodiments, the second liquid layer 280 is formed on the conductive pad 220 for use of forming a binding in the following stage. In some embodiments, the second liquid layer 280 is formed by lowering a temperature of the substrate 210 in an environment including a vapor such that at least a portion of the vapor is condensed to form the second liquid layer 280. In some embodiments, the temperature of the substrate 210 is lowered to about the dew point to form the second liquid layer 280. In some embodiments as shown in FIG. 7, the second liquid layer 280 is formed by showering a vapor 280' to the substrate 210 such that at least a portion of the vapor 280' is condensed to form the second liquid layer 280 on the substrate 210. Specifically, the vapor 280' includes water. In some embodiments, the vapor 280' has a water vapor pressure higher than an ambient water vapor pressure. In some embodiments, the vapor 280' consists essentially of nitrogen and water. In some embodiments, the conductive pad 220 is cleaned (e.g., by gas blowing via an air gun) before forming the another structure S2 (e.g., forming the second liquid layer 280) to remove the contaminants CT.

Reference is made to FIG. 8. In some embodiments, a lateral length of the second micro device 240' is equal to or smaller than 20 μm, such that when the another structure S2 is formed (e.g., when the second micro device 240' is in contact with the second liquid layer 280), the second micro device 240' is gripped by a sticking force produced by at least some portions of the second liquid layer 280 which are between the second electrode 242' of the second micro device 240' and the conductive pad 220. As mentioned above, the "liquid layer assisted binding" is preferably effective when the lateral length of the second micro device 240' is equal to or smaller than 20 μm since a smaller lateral length of the second micro device 240' results in a scaling effect which facilitates the influence of the sticking force and thus the formation of binding. In some embodiments, a thickness of the second liquid layer 280 is smaller than a thickness of the second micro device 240' when the second micro device 240' is gripped by the sticking force produced by the second liquid layer 280. In some alternative embodiments, a sequence between operation 150-1 and operation 150-2 can be changed. That is, the second micro device 240' is placed onto the conductive pad 220 first, and then the second liquid layer 280 is formed on the substrate 210 and some portion of the second liquid layer 280 are penetrated into a space between the second electrode 242' and the conductive pad 220 to grip the second electrode 242' and the conductive pad 220 by the sticking force. In some other alternative embodiments, forming the second liquid layer 280 can be performed both before and after the second micro device 240' is placed onto the conductive pad 220.

Reference is made to FIG. 9. In some embodiments, the second liquid layer 280 is evaporated by increasing the temperature of the conductive pad 220 such that the second electrode 242' is stuck to the conductive pad 220 after the second liquid layer 280 is evaporated. Similar to what has been mentioned above, after the evaporation of the second liquid layer 280, such kind of "liquid layer assisted binding" can make the structural integrity between the second electrode 242' and the conductive pad 220 high enough to hold the second micro device 240' on position and form the electrical contact between the second electrode 242' and the conductive pad 220. As a result, the method 100 as illustrated by the embodiments shown in FIGS. 1 to 5A and 6 to 9 provides a convenient and low, or even zero damage method 100 for replacing a micro device (e.g., first micro device 240 in some embodiments of the present disclosure) of a display device. In some embodiments, in order to stick the second electrode 242' to the conductive pad 220 after the second liquid layer 280 is evaporated, the temperature of the conductive pad 220 may be increased to a range above 150 degrees Celsius. In some embodiments, the range may be below 300 degrees Celsius.

In some embodiments, the temperature of the conductive pad 220 is further increased to be below a eutectic point between the conductive pad 220 and the second electrode 242' (or between the conductive pad 220 and the first electrode 242) and above a boiling point of the second liquid layer 280 after evaporating the second liquid layer 280. Said "below" means a temperature point is below the eutectic point (and also, a melting point of one of the conductive pad 220 and the second electrode 242') but enough to induce an interstitial diffusion between the conductive pad 220 and the second electrode 242' such that the second micro device 240' is "bonded" to the conductive pad 220 to strengthen the solidity between the second electrode 242' and the conductive pad 220. In such embodiments, the second micro device 240' can be better protected due to a lower temperature bonding process. Besides, since there is no "melting", a position precision of the second micro device 240' on the conductive pad 220 is further enhanced.

In some embodiments, the temperature of the conductive pad 220 is increased to be a temperature point such that an interstitial diffusion occurs to bond the second electrode 242' to the conductive pad 220. In still some other embodiments, the temperature of the conductive pad 220 is increased to be above the eutectic point of the conductive pad 220 and the second electrode 242' (or between the conductive pad 220 and the first electrode 242) after evaporating the second liquid layer 280. To satisfy a balance between the criterion for the interstitial diffusion to occur and a trend to decrease a size of a device, a thickness of the first electrode 242 and/or that of the second electrode 242' can be set in a range from about 0.2 µm to 2 µm.

Figure 5B:
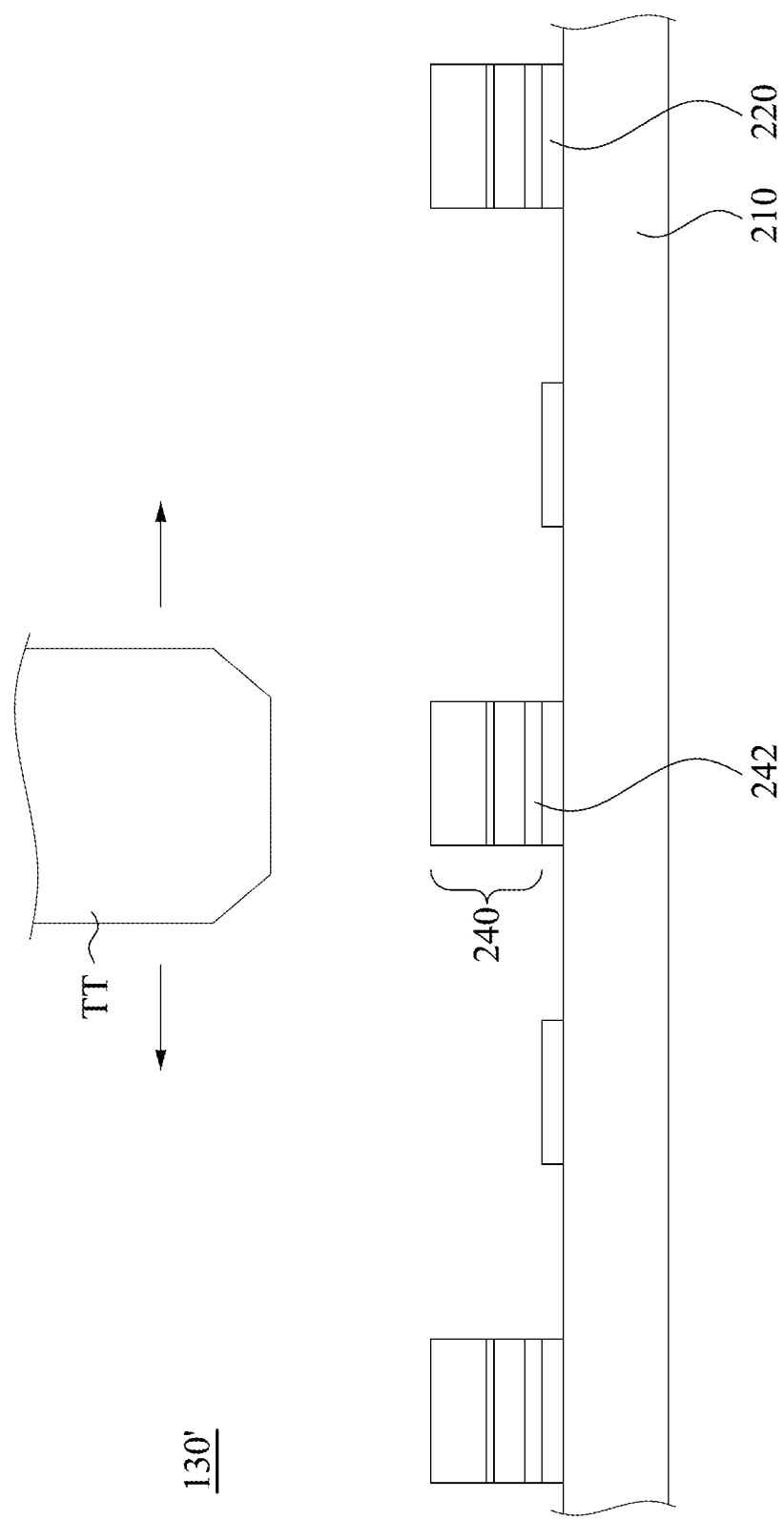
FIG. 5B is a schematic cross-sectional view of an intermediate step of the method for patching an element of a display device according to some embodiments of the present disclosure.

Reference is made back to FIGS. 1 to 3, 5B, and 7 to 9 again. In another aspect, a method 100' for patching an element of a display device begins with operation 110 in which a structure S1 with a first liquid layer 230 between a first micro device 240 and a conductive pad 220 of a substrate 210 is formed. One way to perform operation 110 is that the first liquid layer 230 is formed on the substrate 210 (operation 110-1 as illustrated by FIG. 2), and then the first micro device 240 is placed over the conductive pad 220. In some embodiments, the first micro device 240 is in contact with the first liquid layer 230 (operation 110-2 as illustrated by FIG. 3), but should not be limited thereto. The method 100' continues with operation 120 (but not including FIG. 4) and operation 130' in which the first liquid layer 230 is evaporated, and a determination is performed to check if the first micro device is absent on the conductive pad 220 (as illustrated by FIG. 5B, second site of the conductive pad 220 from the left, and second site of the conductive pad 220 from the right). In some embodiments, the inspection device TT (e.g., the optical inspection device, such as the optical microscope, but should not be limited thereto) is used to find the absence of the first micro device 240. The method 100' continues with operation 150 in which another structure S2 with a second liquid layer 280 between a second electrode 242' of a second micro device 240' and the conductive pad 220 of the substrate 210 is formed. Two opposite surfaces of the second liquid layer 280 are respectively in contact with the second electrode 242' and the conductive pad 220. One way to perform operation 150 is that the second liquid layer 280 is formed on the substrate 210 (operation 150-1 as illustrated by FIG. 7), and then the second micro device 240' including a second electrode 242' which faces the conductive pad 220 is placed over the conductive pad 220 such that the second micro device 240' is in contact with the second liquid layer 280 (operation 150-2 as illustrated by FIG. 8). In some embodiments, the second micro device 240' is gripped by a sticking force produced by the second liquid layer 280 between the second micro device 240' and the conductive pad 220. As mentioned above, when the lateral length of the second micro device 240' is equal to or smaller than 20 µm, a scaling effect will facilitate the influence of the sticking force and thus achieve the formation of binding between the second micro device 240' and the conductive pad 220. The method 100' continues with operation 160 in which the second liquid layer 280 is evaporated such that the second electrode 242' is bound to and is in electrical contact with the conductive pad 220 (as illustrated by FIG. 9).

Notice that two different aspects are present in the same flow chart as shown in FIG. 1 so as to clearly demonstrate the concept of the embodiments of the present disclosure. Briefly speaking, in some embodiments a sequence of operations is operation 110—operation 120—operation 130—operation 140—operation 150—operation 160; and in some other embodiments a sequence of operations is operation 110—operation 120—operation 130'—operation 150—operation 160. Besides, in still some other embodiments, operation 130 (or operation 130') is performed again after operation 160 at will. A sequence of operations 110-1 and 110-2 can be changed, and a sequence of operations 150-1 and 150-2 can be changed. It is noted that the sequences mentioned above are just exemplifications and should not be regarded as limitations to the scope of the present disclosure.

In summary, a method for replacing or patching an element of a display device utilizing the characteristic of a liquid layer assisted binding is provided. As such, low or zero damage and convenient way for replacing or patching the element of the display device are realized.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the method and the structure of the present disclosure without departing from the scope or spirit of the disclosure. In view of the foregoing, it is intended that the present disclosure cover modifications and variations of this disclosure provided they fall within the scope of the following claims.

What is claimed is:

1. A method for replacing an element of a display device, comprising:
   forming a structure with a first liquid layer between a first electrode of a first micro device and a conductive pad of a substrate and two opposite surfaces of the first liquid layer being respectively in contact with the first electrode and the conductive pad, wherein a lateral length of the first micro device is equal to or smaller than 20 µm, such that the first micro device is gripped by a sticking force produced by the first liquid layer between the first micro device and the conductive pad;
   evaporating the first liquid layer such that the first electrode is bound to and is in electrical contact with the conductive pad;
   determining if the first micro device is malfunctioned or misplaced relative to the conductive pad by an optical inspection procedure, wherein the optical inspection procedure comprises:
      inspecting a relationship between a surface of the first electrode facing the conductive pad and a surface of the conductive pad facing the first electrode; and
      determining the first micro device is misplaced if the surface of the first electrode is not parallel to the surface of the conductive pad;
   removing the first micro device when the first micro device is malfunctioned or misplaced from the conductive pad;
   forming another structure with a second liquid layer between a second electrode of a second micro device and the conductive pad of the substrate and two opposite surfaces of the second liquid layer being respectively in contact with the second electrode and the conductive pad, wherein a lateral length of the second micro device is equal to or smaller than 20 µm, such that the second micro device is gripped by a sticking force produced by the second liquid layer between the second micro device and the conductive pad; and
   evaporating the second liquid layer such that the second electrode is bound to and is in electrical contact with the conductive pad.

2. The method of claim 1, wherein the optical inspection procedure further comprises:
   detecting an light intensity of a wavelength in a photoluminescence of the first micro device; and
   determining the first micro device is malfunctioned if the light intensity is smaller than a predetermined value.

3. The method of claim 1, further comprising:
increasing a temperature of the conductive pad to a range above 150 degrees Celsius such that the second electrode is stuck to the conductive pad after the second liquid layer is evaporated.

4. The method of claim 3, wherein the range is below 300 degrees Celsius.

5. The method of claim 1, further comprising:
cleaning the conductive pad before forming the another structure.

6. The method of claim 1, wherein a thickness of the first liquid layer is smaller than a thickness of the first micro device when the first micro device is gripped by the sticking force, and a thickness of the second liquid layer is smaller than a thickness of the second micro device when the second micro device is gripped by the sticking force.

7. The method of claim 1, wherein one of the conductive pad, the first electrode, and the second electrode comprises a bonding material, the bonding material comprises one of tin, indium, and titanium, and said one of tin, indium, and titanium accounts for more than half of a number of atoms of the bonding material.

8. The method of claim 1, wherein a thickness of one of the first electrode and the second electrode ranges from about 0.2 μm to 2 μm.

9. The method of claim 1, wherein one of the conductive pad, the first electrode, and the second electrode comprises one of copper and copper-rich material, wherein the copper-rich material is a material with copper accounts for more than half of a number of atoms therein.

10. The method of claim 1, wherein the first micro device is removed by an adhesive force, mechanical gripping or prying off, an electrostatic force, or vacuum suction.

* * * * *